United States Patent
Saito et al.

(10) Patent No.: US 7,605,426 B2
(45) Date of Patent: Oct. 20, 2009

(54) POWER SEMICONDUCTOR DEVICE

(75) Inventors: Wataru Saito, Kanagawa-ken (JP); Syotaro Ono, Kanagawa-ken (JP); Masakatsu Takashita, Kanagawa-ken (JP); Yasuto Sumi, Kanagawa-ken (JP); Masaru Izumisawa, Kanagawa-ken (JP); Hiroshi Ohta, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 11/933,869

(22) Filed: Nov. 1, 2007

(65) Prior Publication Data

US 2008/0135929 A1    Jun. 12, 2008

(30) Foreign Application Priority Data

Nov. 1, 2006 (JP) .............................. 2006-297369

(51) Int. Cl.
*H01L 29/76* (2006.01)
(52) U.S. Cl. .................... 257/330; 257/329; 257/500
(58) Field of Classification Search ................ 257/330, 257/329, 500
See application file for complete search history.

(56) References Cited

U.S. PATENT DOCUMENTS

| | | | |
|---|---|---|---|
| 6,586,801 B2 | 7/2003 | Iwamoto et al. | |
| 6,768,170 B2 | 7/2004 | Zhou | |
| 6,888,195 B2 | 5/2005 | Saito et al. | |
| 2004/0108568 A1* | 6/2004 | Qu | 257/500 |
| 2005/0221547 A1* | 10/2005 | Yamauchi et al. | 438/172 |
| 2007/0114602 A1 | 5/2007 | Saito et al. | |
| 2008/0012026 A1* | 1/2008 | Tsuji | 257/77 |

FOREIGN PATENT DOCUMENTS

| JP | 2001-313391 | 11/2001 |
|---|---|---|
| JP | 2004-282007 | 10/2004 |

* cited by examiner

*Primary Examiner*—Long Pham
(74) *Attorney, Agent, or Firm*—Oblon, Spivak, McClelland, Maier & Neustadt, L.L.P.

(57) ABSTRACT

A power semiconductor device includes: a semiconductor substrate; a gate insulating film; a control electrode insulated from the semiconductor substrate by the gate insulating film; a first main electrode provided on a lower surface side of the semiconductor substrate; and a second main electrode provided on an upper surface side of the semiconductor substrate. The semiconductor substrate includes: a first first-conductivity-type semiconductor layer with its lower surface connected to the first main electrode; a second first-conductivity-type semiconductor layer and a third second-conductivity-type semiconductor layer formed on the first first-conductivity-type semiconductor layer and alternately arranged parallel to the upper surface of the semiconductor substrate; a trench formed in a directly overlying region of the third second-conductivity-type semiconductor layer, with part of the second main electrode buried in the trench; a fourth second-conductivity-type semiconductor layer selectively formed in a surface of the second first-conductivity-type semiconductor layer and connected to the second main electrode; a fifth first-conductivity-type semiconductor layer selectively formed in a surface of the fourth second-conductivity-type semiconductor layer and connected to the second main electrode; and a sixth second-conductivity-type semiconductor layer formed at a bottom of the trench and connected to the second main electrode. Impurity concentration in the sixth second-conductivity-type semiconductor layer is higher than impurity concentration in the fourth second-conductivity-type semiconductor layer, and lower surface of the sixth second-conductivity-type semiconductor layer is located below lower surface of the fourth second-conductivity-type semiconductor layer.

20 Claims, 15 Drawing Sheets

POWER SEMICONDUCTOR DEVICE

CROSS-REFERENCE TO RELATED APPLICATIONS

This application is based upon and claims the benefit of priority from the prior Japanese Patent Application No. 2006-297369, filed on Nov. 1, 2006; the entire contents of which are incorporated herein by reference.

BACKGROUND OF THE INVENTION

1. Field of the Invention

This invention relates to a power semiconductor device, and more particularly to a power semiconductor device having a superjunction structure.

2. Background Art

The ON resistance of a power semiconductor device such as a vertical power MOSFET (metal oxide semiconductor field effect transistor) greatly depends on the electric resistance of its conduction layer (drift layer). The dopant concentration that determines the electric resistance of the drift layer cannot exceed a maximum limit, which depends on the breakdown voltage required for a pn junction between the base layer and the drift layer. Thus there is a tradeoff between the device breakdown voltage and the ON resistance. Improving this tradeoff is important for improving the performance of low power consumption devices. This tradeoff has a limit determined by the device material. Overcoming this limit is the way to realizing devices with low ON resistance beyond existing power devices.

As an example MOSFET overcoming this limit, a MOSFET having a structure called a superjunction structure is known, where p-pillar layers and n-pillar layers are alternately buried in the drift layer (see, e.g., JP-A 2004-282007 (Kokai)). In the superjunction structure, a non-doped layer is artificially produced by equalizing the amount of charge (amount of impurities) contained in the p-pillar layer with the amount of charge contained in the n-pillar layer. Thus, while holding high breakdown voltage, current is passed through the highly doped n-pillar layer. Hence low ON resistance beyond the material limit can be achieved.

Thus, in a vertical power MOSFET, the superjunction structure can be used to realize an ON resistance/breakdown voltage tradeoff beyond the material limit. By such an improved tradeoff, the chip area can be decreased with the ON resistance kept at a prescribed value. In this case, the chip area is decreased with the operating current kept constant, which results in increasing the density of current flowing in the chip. Hence the decrease in chip area also results in increasing current density during bipolar operation of the vertical power MOSFET, such as during avalanche breakdown and during recovery operation of the built-in diode. If the current density during bipolar operation increases, the carrier density in the device also increases. If the carrier density in the device increases by a certain degree or more, carrier charging results in increasing electric field strength and causing current concentration, and the device leads to breakdown. That is, another problem has arisen where the decrease of ON resistance and the reduction of chip area due to the superjunction structure lead to the increase of current density, causing the decrease of avalanche withstand capability and recovery withstand capability.

SUMMARY OF THE INVENTION

According to an aspect of the invention, there is provided a power semiconductor device including: a semiconductor substrate; a gate insulating film; a control electrode insulated from the semiconductor substrate by the gate insulating film; a first main electrode provided on a lower surface side of the semiconductor substrate; and a second main electrode provided on an upper surface side of the semiconductor substrate, the semiconductor substrate including: a first first-conductivity-type semiconductor layer with its lower surface connected to the first main electrode; a second first-conductivity-type semiconductor layer and a third second-conductivity-type semiconductor layer formed on the first first-conductivity-type semiconductor layer and alternately arranged parallel to the upper surface of the semiconductor substrate; a trench formed in a directly overlying region of the third second-conductivity-type semiconductor layer, with part of the second main electrode buried in the trench; a fourth second-conductivity-type semiconductor layer selectively formed in a surface of the second first-conductivity-type semiconductor layer and connected to the second main electrode; a fifth first-conductivity-type semiconductor layer selectively formed in a surface of the fourth second-conductivity-type semiconductor layer and connected to the second main electrode; and a sixth second-conductivity-type semiconductor layer formed at a bottom of the trench and connected to the second main electrode, impurity concentration in the sixth second-conductivity-type semiconductor layer being higher than impurity concentration in the fourth second-conductivity-type semiconductor layer, and lower surface of the sixth second-conductivity-type semiconductor layer being located below lower surface of the fourth second-conductivity-type semiconductor layer.

DETAILED DESCRIPTION OF THE INVENTION

Figure 1:
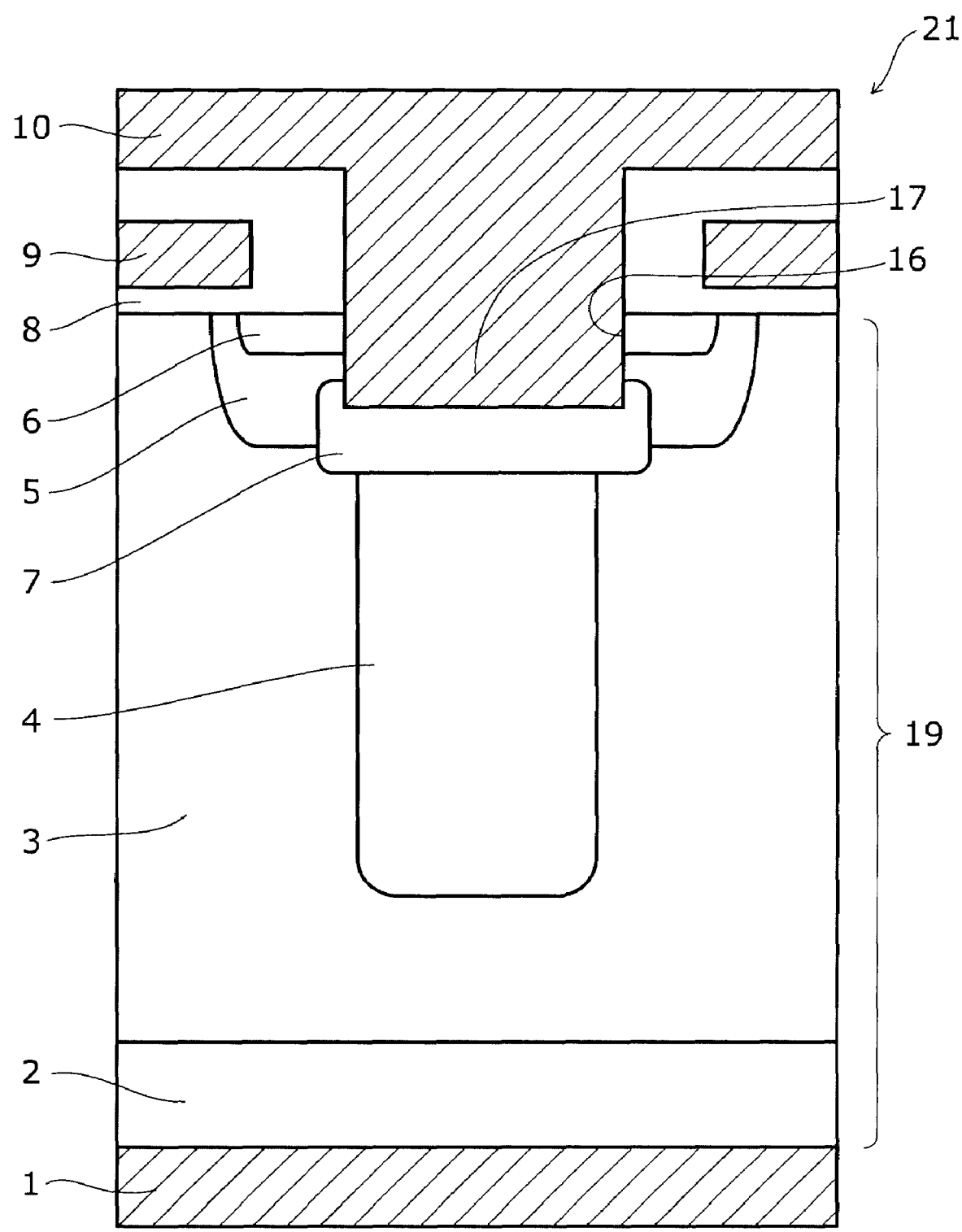
FIG. 1 is a cross-sectional view schematically illustrating a power MOSFET according to a first embodiment of the invention.

Embodiments of the invention will now be described with reference to the drawings. In the following embodiments, it is assumed that the first conductivity type and the second conductivity type are n-type and p-type, respectively. Like elements in the drawings are marked with like reference numerals.

First Embodiment

FIG. 1 is a cross-sectional view schematically illustrating a power MOSFET according to a first embodiment of the invention.

It is noted that FIG. 1 shows only the cell section of the power MOSFET. The same also applies to FIGS. 2 to 11 described below.

As shown in FIG. 1, the power MOSFET 21 according to this embodiment includes an n-type semiconductor substrate 19, which is illustratively an n-type silicon substrate. An $n^+$-drain layer 2 is formed as a first semiconductor layer in the lower surface of the lower portion of the semiconductor substrate 19. A drain electrode 1 is provided as a first main electrode on the downside of the semiconductor substrate 19 so as to be in contact with the $n^+$-drain layer 2.

Above the $n^+$-drain layer 2 in the semiconductor substrate 19, a plurality of stripe-shaped p-pillar layers 4 (third semiconductor layers) are formed. The portion of the semiconductor substrate 19 between the p-pillar layers 4 constitutes a stripe-shaped n-pillar layer 3 (second semiconductor layer). Thus the n-pillar layers 3 and the p-pillar layers 4 are alternately and periodically arranged parallel to the upper surface of the semiconductor substrate 19 to form a superjunction structure. In the surface of both widthwise sides of each n-pillar layer 3, a p-base layer 5 is formed as a fourth semiconductor layer like a stripe. In the surface of the p-base layer 5, an n-source layer 6 is formed as a fifth semiconductor layer like a stripe. That is, the p-base layer 5 is selectively formed in part of the surface of the n-pillar layer 3, and the n-source layer 6 is selectively formed in part of the surface of the p-base layer 5.

A gate insulating film 8 illustratively made of silicon oxide film having a thickness of approximately 0.1 μm is formed on the semiconductor substrate 19. On the gate insulating film 8 directly above the n-pillar layer 3, a gate electrode 9 is formed as a control electrode. The gate electrode 9 is insulated from the semiconductor substrate 19 by the gate insulating film 8. The gate electrode 9 extends like a stripe parallel to the n-pillar layer 3, and extends from the edge of the directly overlying region of the n-source layer 6 formed in one side of the n-pillar layer 3 through the directly overlying region of the p-base layer 5, the n-pillar layer 3, and the p-base layer 5 to the edge of the directly overlying region of the n-source layer 6 formed in the other side of the n-pillar layer 3. Thus the insulated gate structure composed of the p-base layer 5, the n-source layer 6, the n-pillar layer 3, the gate insulating film 8, and the gate electrode 9 constitutes a planar gate structure. The gate electrode 9 is surrounded by the insulating film, and a source electrode 10 is provided on this insulating film. That is, the source electrode 10 is provided on the upside of the semiconductor substrate 19.

In the upper surface of the semiconductor substrate 19 directly above the p-pillar layer 4, a trench 16 is formed. Part of the source electrode 10 is buried inside the trench 16. That is, the source electrode 10 protrudes downward in the directly overlying region of the p-pillar layer 4, and the protruding portion enters the trench 16. The portion of the source electrode 10 located in the trench 16 constitutes a trench contact 17.

A $p^+$-contact layer 7 is formed on the periphery of the bottom of the trench 16, or the lower end of the trench contact 17. The impurity concentration in the $p^+$-contact layer 7 is higher than the impurity concentration in the p-base layer 5. The $p^+$-contact layer 7 is formed at a deeper position than the p-base layer 5. That is, the $p^+$-contact layer 7 protrudes downward from the lower surface of the p-base layer 5, and the lower surface of the $p^+$-contact layer 7 is located lower than the lower surface of the p-base layer 5. The lower surface of the trench contact 17 is located lower than the lower surface of the n-source layer 6 and the upper surface of the $p^+$-contact layer 7, and higher than the lower surface of the p-base layer 5 and the lower surface of the $p^+$-contact layer 7. Thus the p-base layer 5, the n-source layer 6, and the $p^+$-contact layer 7 are connected to the trench contact 17.

Next, the operation and effect of this embodiment are described.

In conventional structures, a trench is formed in the semiconductor substrate, a $p^+$-contact layer is formed at the bottom of the trench, and a trench contact connected to a source electrode is formed inside the trench, whereas the $p^+$-contact layer is located inside the p-base layer. Hence holes generated in the drift layer with a superjunction structure formed therein flow from the bottom of the p-base layer into the p-base layer, pass through the p-base layer and the $p^+$-contact layer, and then flow into the source electrode. However, this path has high resistance because the impurity concentration in the p-base layer is as low as approximately 1/100 of the impurity concentration in the $p^+$-contact layer. Hence the hole discharge resistance is also high. If the hole discharge resistance is high, holes are likely to be accumulated in the drift layer, and the positive charge of the holes increases electric field strength. This results in increasing the probability of carrier generation due to avalanche breakdown. That is, avalanche breakdown is likely to occur, or a weak avalanche breakdown is replaced by a more prominent breakdown, generating more carriers. This creates a positive feedback situation where carriers in the device increase, the electric field strength further increases, and carriers further increase. Thus the device leads to breakdown.

In contrast, in this embodiment, the $p^+$-contact layer 7 is formed below the p-base layer 5. Hence holes generated in the drift layer (the n-pillar layer 3 and the p-pillar layer 4) during avalanche breakdown or during recovery operation of the built-in diode flow from the drift layer directly into the $p^+$-contact layer 7 and are discharged through the trench contact 17 to the source electrode 10. Thus the hole discharge resistance is small. If the hole discharge resistance is small, holes are rapidly discharged and less prone to being accumulated in the drift layer. If holes are less prone to being accumulated, the increase of electric field strength due to the positive charge of the holes can be restrained, and device breakdown can be prevented. Hence the positive feedback situation as described above is unlikely to occur even during avalanche breakdown and during recovery operation of the built-in diode, and the device is unlikely to be destroyed. That is, the structure according to this embodiment is effective for realizing a device with high withstand capability.

Thus this embodiment can solve the problem associated with the formation of the superjunction structure, that is, the problem where the decrease of device ON resistance and the reduction of chip area lead to the increase of carrier concentration, causing the decrease of avalanche withstand capability and recovery withstand capability. It is noted that, in a device without a superjunction structure, if the $p^+$-contact layer is formed below the p-base layer, electric field concentrates on the protruding $p^+$-contact layer, contrarily decreasing the breakdown voltage. However, in this embodiment, because the device has a superjunction structure, the electric field distribution is uniform in the drift layer, and electric field concentration is unlikely to occur. Hence there is no decrease in the breakdown voltage.

Next, a first variation of this embodiment is described.

Figure 2:
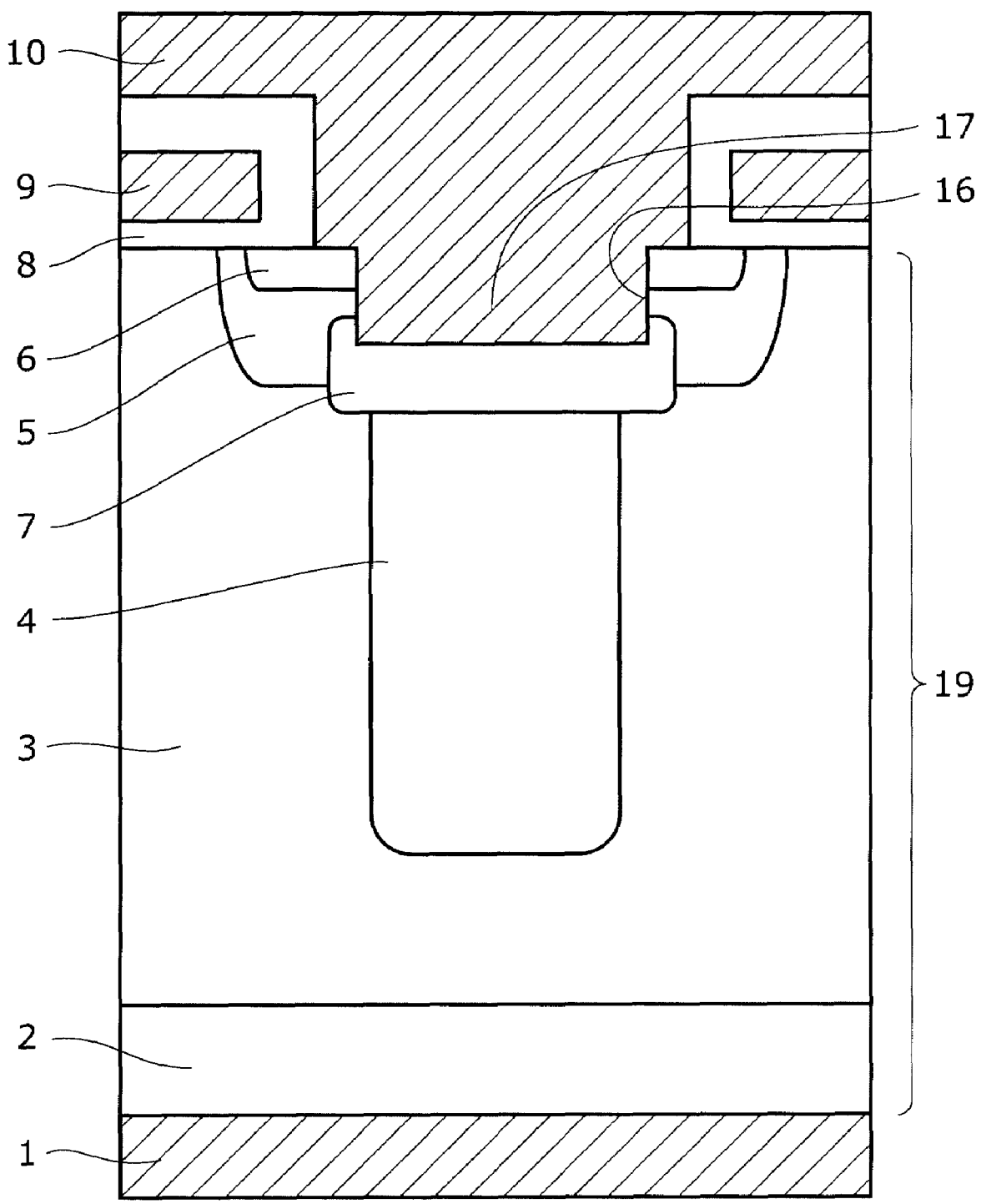
FIG. 2 is a cross-sectional view schematically illustrating a power MOSFET according to a first variation of the first embodiment.

FIG. 2 is a cross-sectional view schematically illustrating a power MOSFET according to this variation.

As shown in FIG. 2, in the MOSFET according to this variation, in the protruding portion of the source electrode 10, the width of the portion located above the semiconductor substrate 19 is larger than the portion buried inside the semiconductor substrate 19, or the trench contact 17. Thus a step is formed at the level corresponding to the surface of the semiconductor substrate 19. This step is in contact with part of the surface of the n-source layer 6.

In the first embodiment described above, as shown in FIG. 1, the n-source layer 6 is connected to the source electrode 10 only on the sidewall of the trench 16. However, in this variation, as shown in FIG. 2, the n-source layer 6 is connected to the source electrode 10 both on the sidewall and the step of the trench 16. That is, part of the surface of the n-source layer 6 is also connected to the source electrode 10. Thus the hole discharge resistance can be further decreased. The configuration, operation, and effect in this variation other than the foregoing are the same as those in the first embodiment described above.

Next, a second variation of this embodiment is described.

Figure 3:
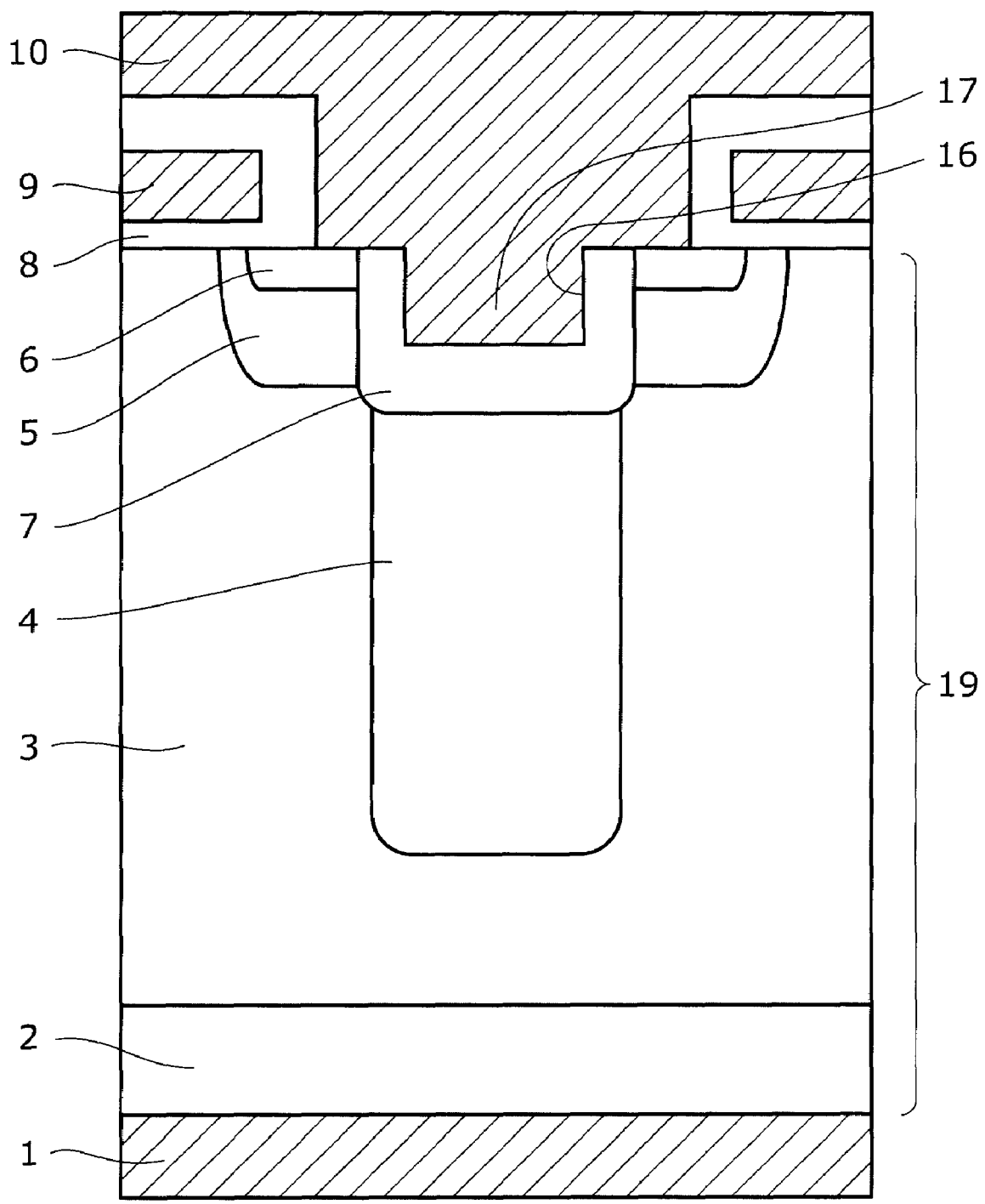
FIG. 3 is a cross-sectional view schematically illustrating a power MOSFET according to a second variation of the first embodiment.

FIG. 3 is a cross-sectional view schematically illustrating a power MOSFET according to this variation.

As shown in FIG. 3, in this variation, the $p^+$-contact layer 7 is formed not only at the bottom of the trench 16 but also on the sidewall thereof. That is, the $p^+$-contact layer 7 entirely covers the bottom and side face of the trench contact 17. Thus holes can be discharged from the entire trench 16, and the hole discharge resistance can be further decreased. For example, holes entering the p-base layer 5 from the n-pillar layer 3 can also be discharged efficiently through the $p^+$-contact layer 7. Although not shown, the contact of the source electrode 10 including the termination section can be achieved by a deep trench contact and a $p^+$-contact layer to rapidly discharge holes generated in the termination section as well, enabling the withstand capability of the overall device to be improved. The configuration, operation, and effect in this variation other than the foregoing are the same as those in the first variation described above.

Second Embodiment

Figure 4:
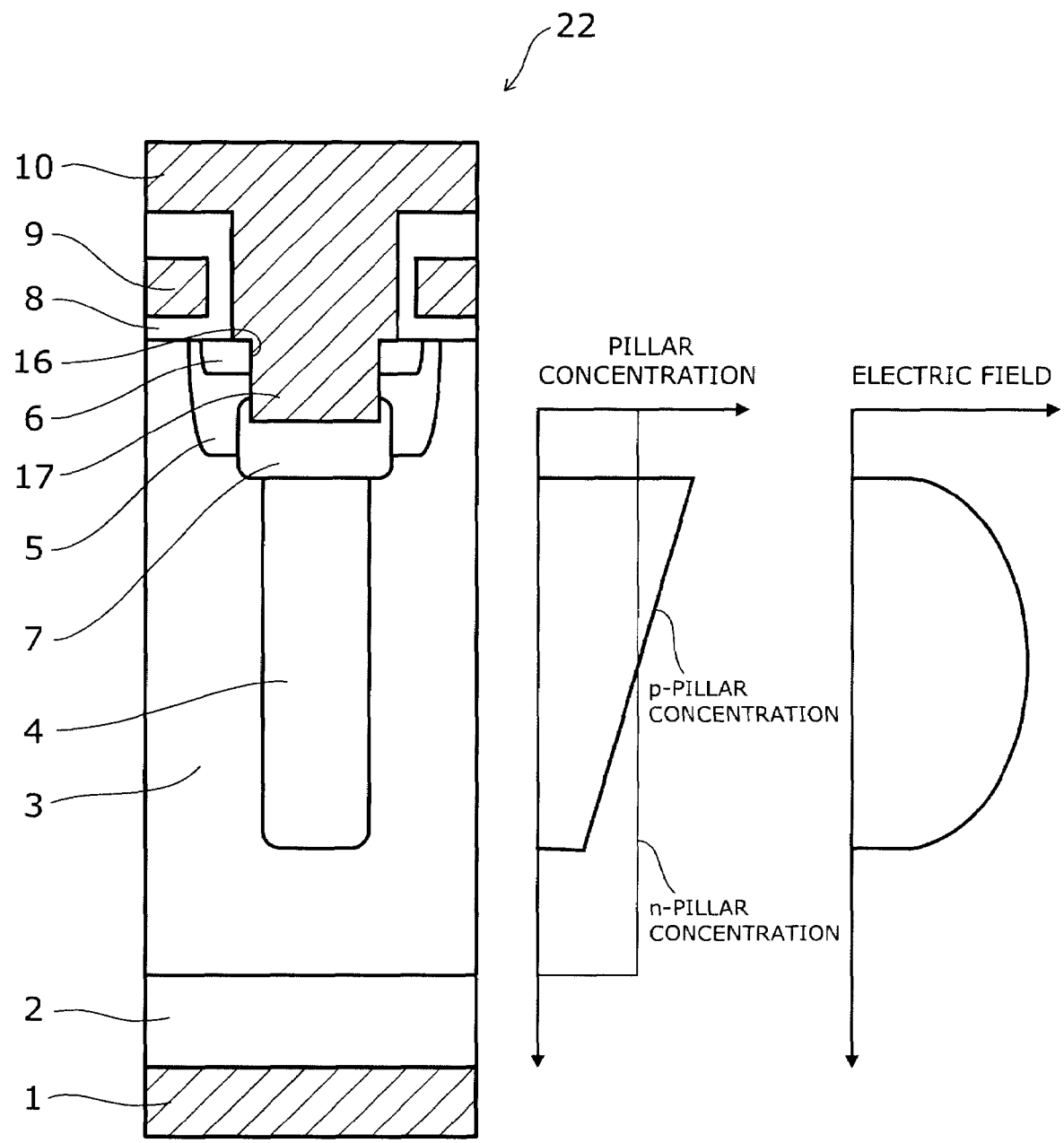
FIG. 4 is a cross-sectional view schematically illustrating the configuration of a power MOSFET according to a second embodiment of the invention, and schematic graphs illustrating impurity concentration (pillar concentration) in its n-pillar layer and p-pillar layer and electric field therein in correlation with position along the thickness direction.

FIG. 4 shows a cross-sectional view schematically illustrating the configuration of a power MOSFET according to a second embodiment of the invention, and schematic graphs illustrating impurity concentration (pillar concentration) in the n-pillar layer and the p-pillar layer and the electric field therein in correlation with position along the depth direction.

As shown in FIG. 4, in the power MOSFET 22 according to this embodiment, the impurity concentration in the p-pillar layer 4 (p-pillar concentration) varies continuously along the depth direction, maximized at the upper end of the p-pillar layer 4 and decreasing downward. On the other hand, the impurity concentration in the n-pillar layer 3 (n-pillar concentration) is constant along the depth direction. The width of the n-pillar layer 3 and the p-pillar layer 4 is constant along the depth direction. Hence the impurity amount in the pillar layer at an arbitrary position along the depth direction, or the impurity amount given by the product of impurity concentration and pillar width at the position, is large in the upper portion and small in the lower portion for the p-pillar layer 4, and is constant along the depth direction for the n-pillar layer 3. Consequently, in the upper portion of the superjunction structure composed of the n-pillar layers 3 and the p-pillar layers 4, the impurity amount in the p-pillar layer 4 is larger than the impurity amount in the n-pillar layer 3, and in the lower portion of the superjunction structure, the impurity amount in the n-pillar layer 3 is larger than the impurity amount in the p-pillar layer 4. The configuration in this embodiment other than the foregoing is the same as that in the first variation of the first embodiment described above.

Next, the operation and effect of this embodiment are described.

As described above, in a power MOSFET, the $p^+$-contact layer 7 is formed at a deeper position than the p-base layer 5, and hence electric field is likely to concentrate on the lower surface of the $p^+$-contact layer 7. However, because of the existence of the superjunction structure, the electric field distribution in the drift layer is flat, and hence the occurrence of avalanche breakdown is prevented. However, to prevent the occurrence of avalanche breakdown more definitely, it is preferable to reduce electric field at the lower surface of the $p^+$-contact layer 7.

Hence, in this embodiment, the pillar concentration is sloped as described above. Thus, as shown in FIG. 4, the electric field in the superjunction structure is strongest at the center, and weaker at the upper and lower end than at the center. Hence the electric field is weakened at the lower surface of the $p^+$-contact layer 7 located at the upper end of the superjunction structure. By such displacement of the position of the strongest electric field from the position of the lower surface of the $p^+$-contact layer 7, avalanche breakdown is unlikely to occur at the lower surface of the $p^+$-contact layer 7, and occurs, if any, at the center of the superjunction structure. Thus higher avalanche withstand capability and higher recovery withstand capability can be realized. The operation and effect in this embodiment other than the foregoing are the same as those in the first variation of the first embodiment described above.

Next, a variation of the second embodiment is described.

Figure 5:
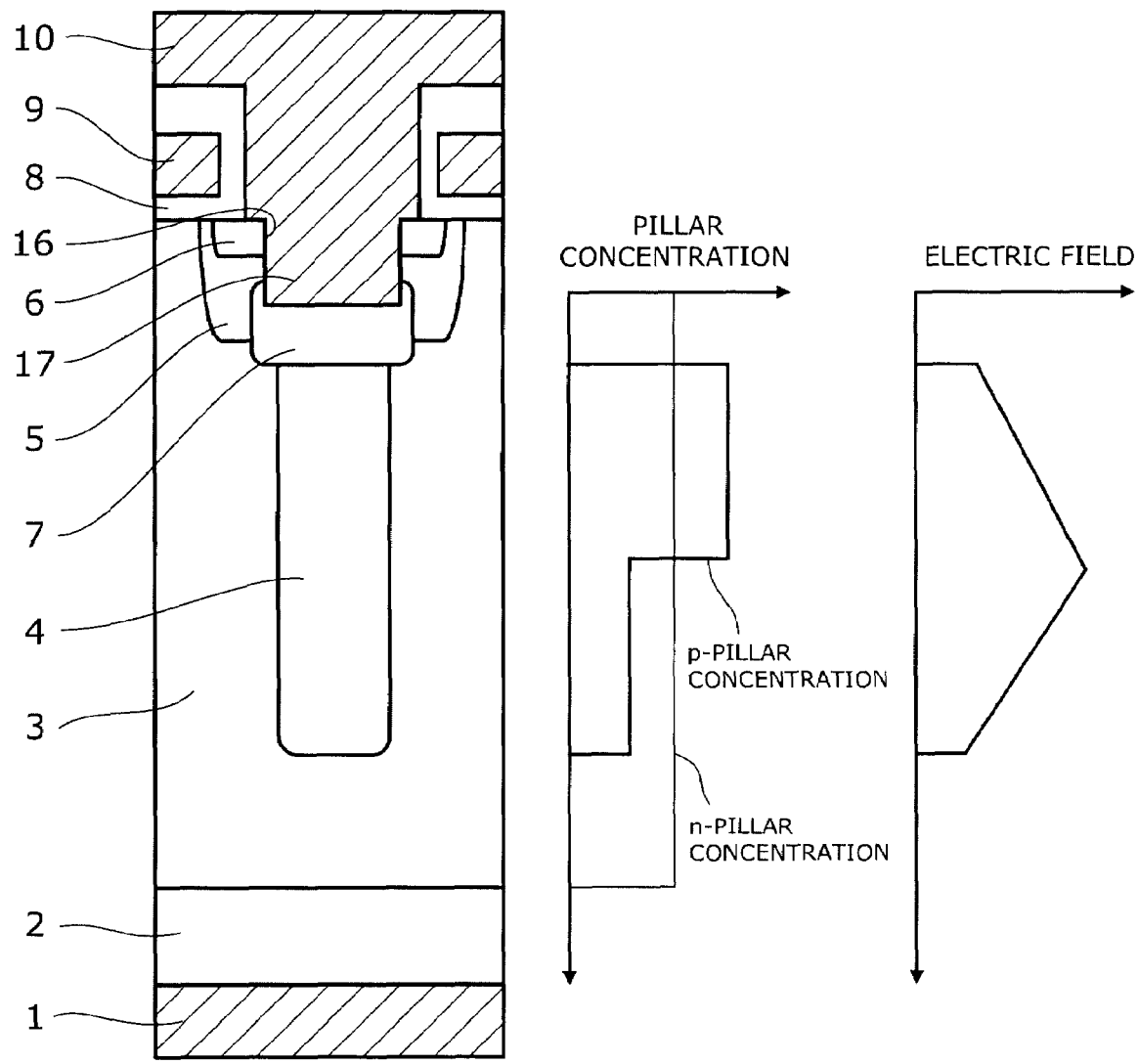
FIG. 5 is a cross-sectional view schematically illustrating the configuration of a power MOSFET according to a variation of the second embodiment, and schematic graphs illustrating impurity concentration (pillar concentration) in its n-pillar layer and p-pillar layer and electric field therein in correlation with position along the depth direction.

FIG. 5 shows a cross-sectional view schematically illustrating the configuration of a power MOSFET according to this variation, and schematic graphs illustrating impurity concentration (pillar concentration) in the n-pillar layer and the p-pillar layer and the electric field therein in correlation with position along the depth direction.

As shown in FIG. 5, in this variation, the impurity concentration in the p-pillar layer 4 varies stepwise. This also serves to achieve the same effect as that of the second embodiment described above. While FIG. 5 illustrates two-step variation of impurity concentration, it may be varied in three or more steps. The impurity concentration profile like this can be realized by, for example, forming a p-pillar layer 4 by a plurality of iterations of ion implantation with the amount of implantation varied for each iteration of ion implantation.

In the profile illustrated in the second embodiment described above and this variation, the impurity concentration in the p-pillar layer is high in the upper portion and low in the lower portion while the impurity concentration in the n-pillar layer is left constant. However, the invention is not limited thereto. The same effect is achieved also by increasing the impurity concentration in the n-pillar layer downward, or by varying both the impurity concentration in the p-pillar layer and the impurity concentration in the n-pillar layer. Alternatively, the width of the p-pillar layer may be varied so as to be thick in the upper portion and thin in the lower portion while the impurity concentration in the n-pillar layer and the p-pillar layer is left constant along the depth direction. Then the impurity amount given by the product of the width of the p-pillar layer and the impurity concentration therein is distributed so as to be large in the upper portion and small in the lower portion.

Third Embodiment

Figure 6:
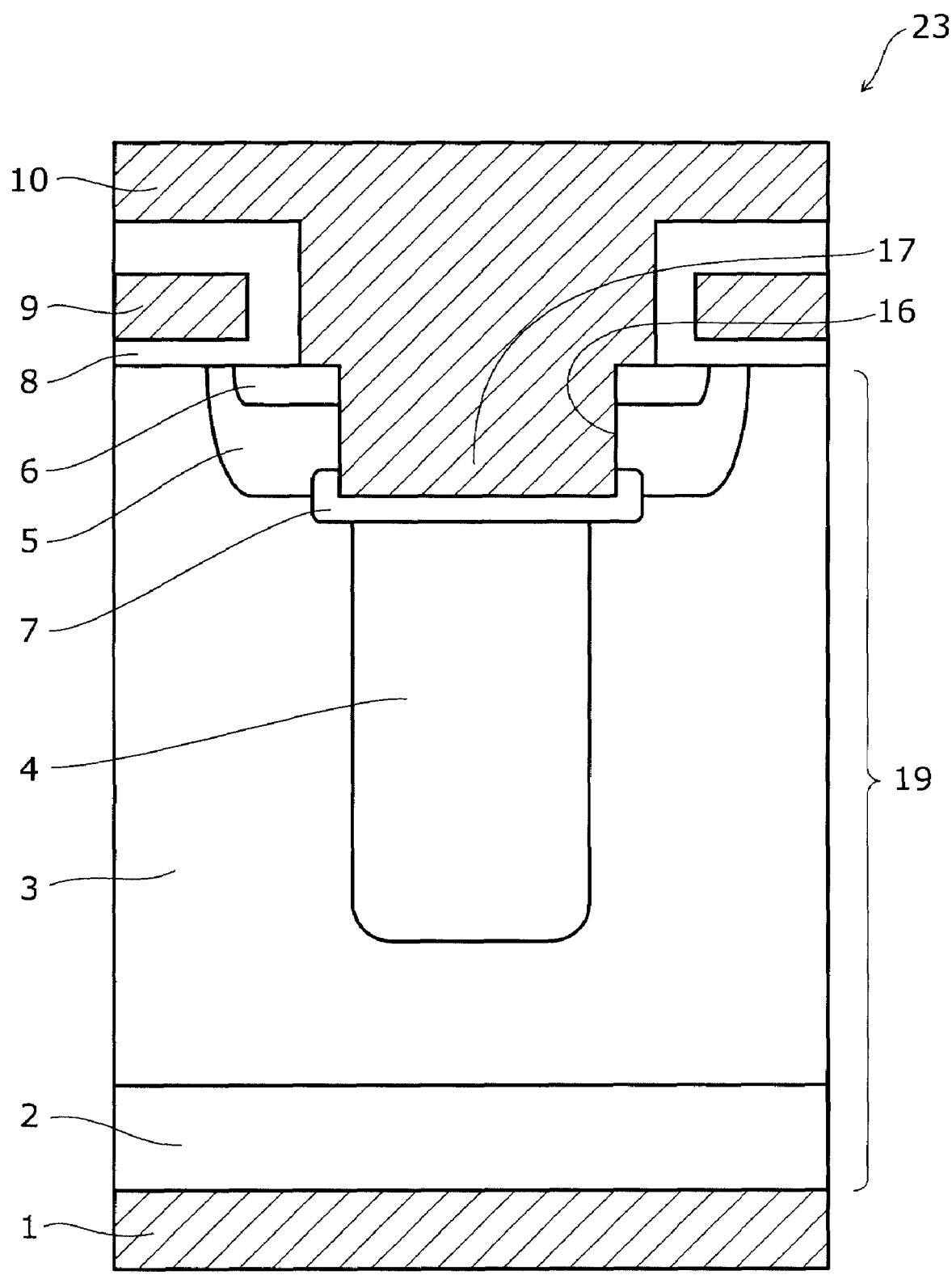
FIG. 6 is a cross-sectional view schematically illustrating the configuration of a power MOSFET according to a third embodiment of the invention.

FIG. 6 is a cross-sectional view schematically illustrating the configuration of a power MOSFET according to a third embodiment of the invention.

As shown in FIG. 6, in the power MOSFET 23 according to this embodiment, the depth of the trench 16 is substantially equal to the junction depth of the p-base layer 5. More specifically, as compared with the first and second embodiment described above, the trench contact 17 is formed to a deeper position, and the lower surface of the trench contact 17 is located substantially as high as the lower surface of the p-base layer 5. Because the diffusion depth of the p$^+$-contact layer 7 is approximately 0.3 to 1 μm, the height difference between the lower surface of the trench contact 17 and the lower surface of the p-base layer 5 is preferably less than 0.3 to 1 μm.

In this embodiment, the trench contact 17 is formed deeper, and the p$^+$-contact layer 7 is thinned accordingly. This results in decreasing the resistance of the p$^+$-contact layer 7 and decreasing the hole discharge resistance, and higher withstand capability can be obtained. In contrast, if the trench contact 17 is too shallow, the p$^+$-contact layer 7 needs to be thickened for forming the p$^+$-contact layer 7 deeper than the p-base layer 5, unfortunately increasing the resistance of the p$^+$-contact layer 7. Alternatively, the p$^+$-contact layer 7 can be thinned by sufficiently increasing the impurity concentration in the p$^+$-contact layer 7. Also in this case, it is possible to prevent the p$^+$-contact layer 7 from being entirely depleted, and to prevent the depletion layer from being brought into contact with the trench contact 17. The configuration, operation, and effect in this embodiment other than the foregoing are the same as those in the second embodiment described above.

Fourth Embodiment

Figure 7:
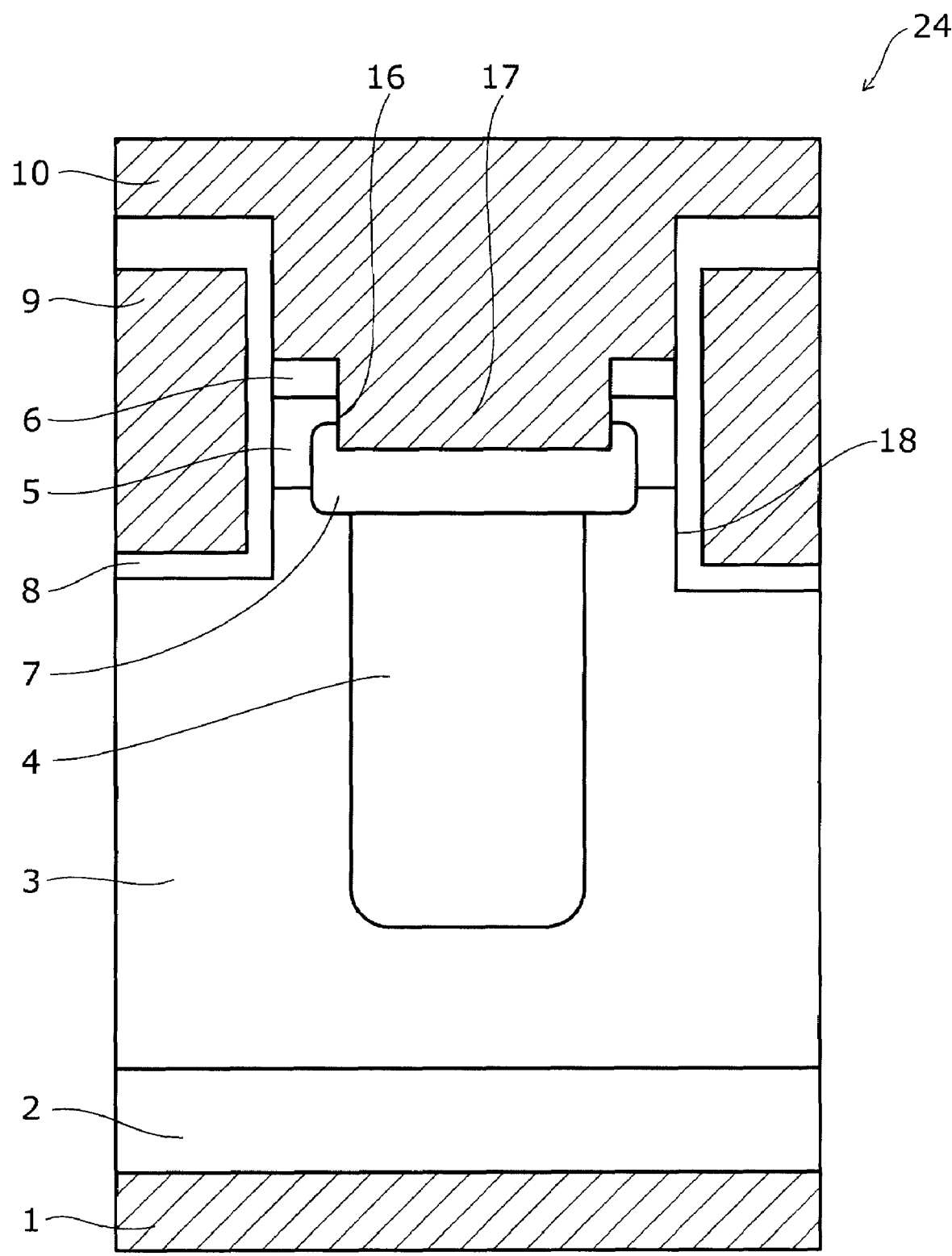
FIG. 7 is a cross-sectional view schematically illustrating the configuration of a power MOSFET according to a fourth embodiment of the invention.

FIG. 7 is a cross-sectional view schematically illustrating the configuration of a power MOSFET according to a fourth embodiment of the invention.

In the first to third embodiment and their variations described above, the MOS gate has a planar gate structure with the gate electrode 9 placed on the semiconductor substrate 19. In contrast, in the power MOSFET 24 according to this embodiment, as shown in FIG. 7, the MOSFET gate has a trench gate structure with part of the gate electrode 9 buried in the semiconductor substrate 19. More specifically, besides the trench 16, a gate trench 18 is formed in the upper surface of the semiconductor substrate 19, and a gate electrode 9 is buried inside the gate trench 18 via a gate insulating film 8. In this embodiment, use of a trench gate structure as the MOS gate structure can provide finer pitch. Even if the trench gate structure is used, high withstand capability as in the planar gate structure can be achieved by forming the p$^+$-contact layer 7 below the p-base layer 5. The configuration, operation, and effect in this embodiment other than the foregoing are the same as those in the second embodiment described above, for example.

Next, a first variation of the fourth embodiment is described.

Figure 8:
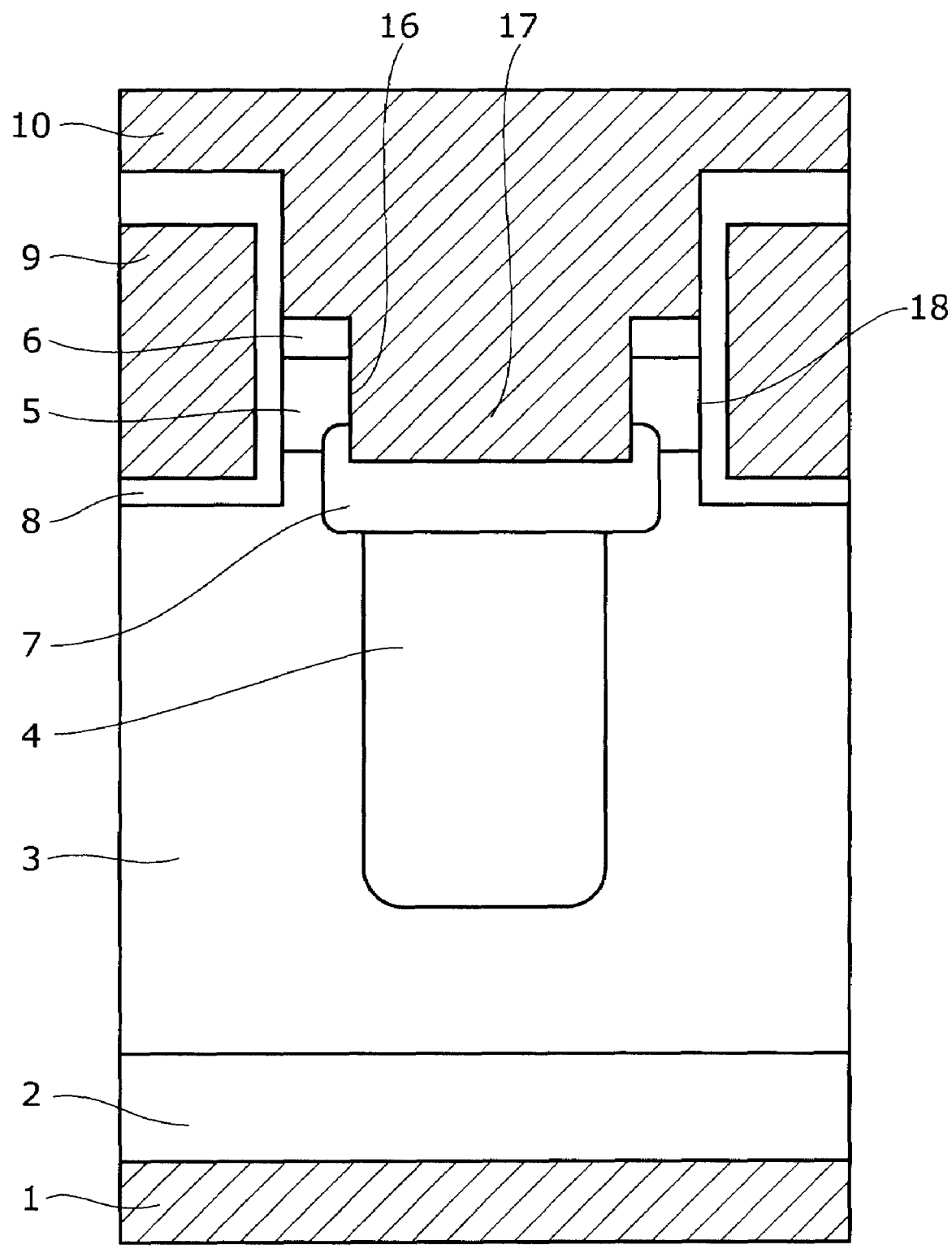
FIG. 8 is a cross-sectional view schematically illustrating a power MOSFET according to a first variation of the fourth embodiment.

FIG. 8 is a cross-sectional view schematically illustrating a power MOSFET according to this variation.

In the power MOSFET 24 (see FIG. 7) according to the fourth embodiment described above, the MOS gate structure of the power MOSFET 22 (see FIG. 4) according to the second embodiment described above, for example, is simply changed from the planar gate structure to the trench gate structure. Hence the lower surface of the gate electrode 9 is inevitably formed at a deeper position than the lower surface of the p-base layer 5. Thus electric field is enhanced at the bottom of the gate electrode 9. Furthermore, when a hole is generated near the bottom of the gate electrode 9, this hole is discharged through the n-pillar layer 3 to the trench contact 17. Hence the discharge resistance somewhat increases. Thus avalanche breakdown may be likely to occur at the bottom of the gate electrode 9.

Hence, in this variation, as shown in FIG. 8, the p$^+$-contact layer 7 is formed at a deeper position than the gate electrode 9. More specifically, the lower surface of the p$^+$-contact layer 7 is located lower than the lower surface of the gate electrode 9. Thus electric field concentration at the bottom of the gate electrode 9 can be alleviated, and the discharge resistance of holes generated near the bottom of the gate electrode 9 can be decreased. Consequently, the withstand capability can be further improved.

Next, a second variation of the fourth embodiment is described.

Figure 9:
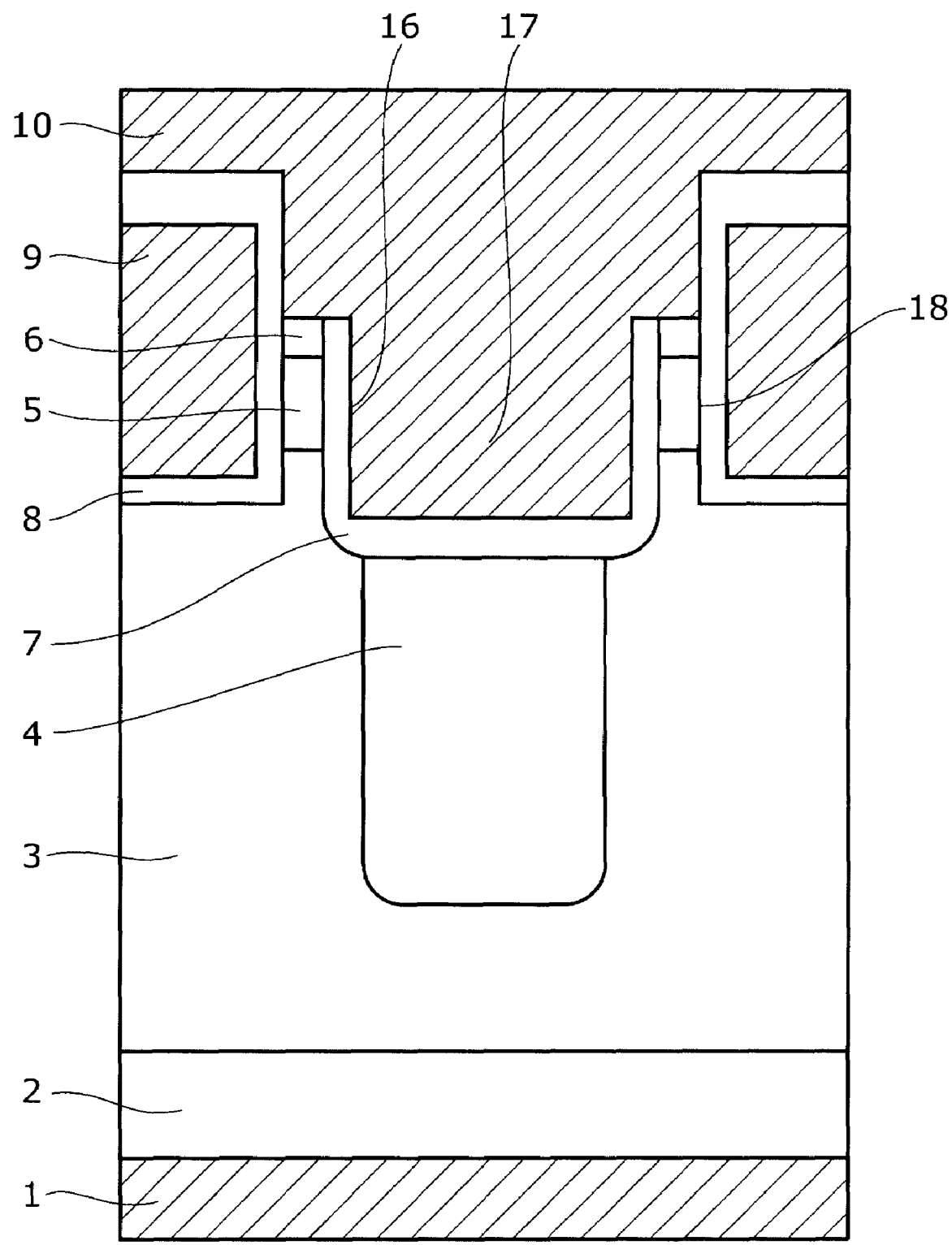
FIG. 9 is a cross-sectional view schematically illustrating a power MOSFET according to a second variation of the fourth embodiment.

FIG. 9 is a cross-sectional view schematically illustrating a power MOSFET according to this variation.

As shown in FIG. 9, in this variation, the trench contact 17 is formed deeper than the bottom of the gate electrode 9. Thus the junction depth of the p$^+$-contact layer 7 is deeper than the lower surface of the gate electrode 9. Furthermore, the p$^+$-contact layer 7 is formed also on the sidewall of the trench 16 so that the trench contact 17 is not directly connected to the n-pillar layer 3 and the p-pillar layer 4. Consequently, the hole discharge resistance can be further decreased.

Fifth Embodiment

Figure 10:
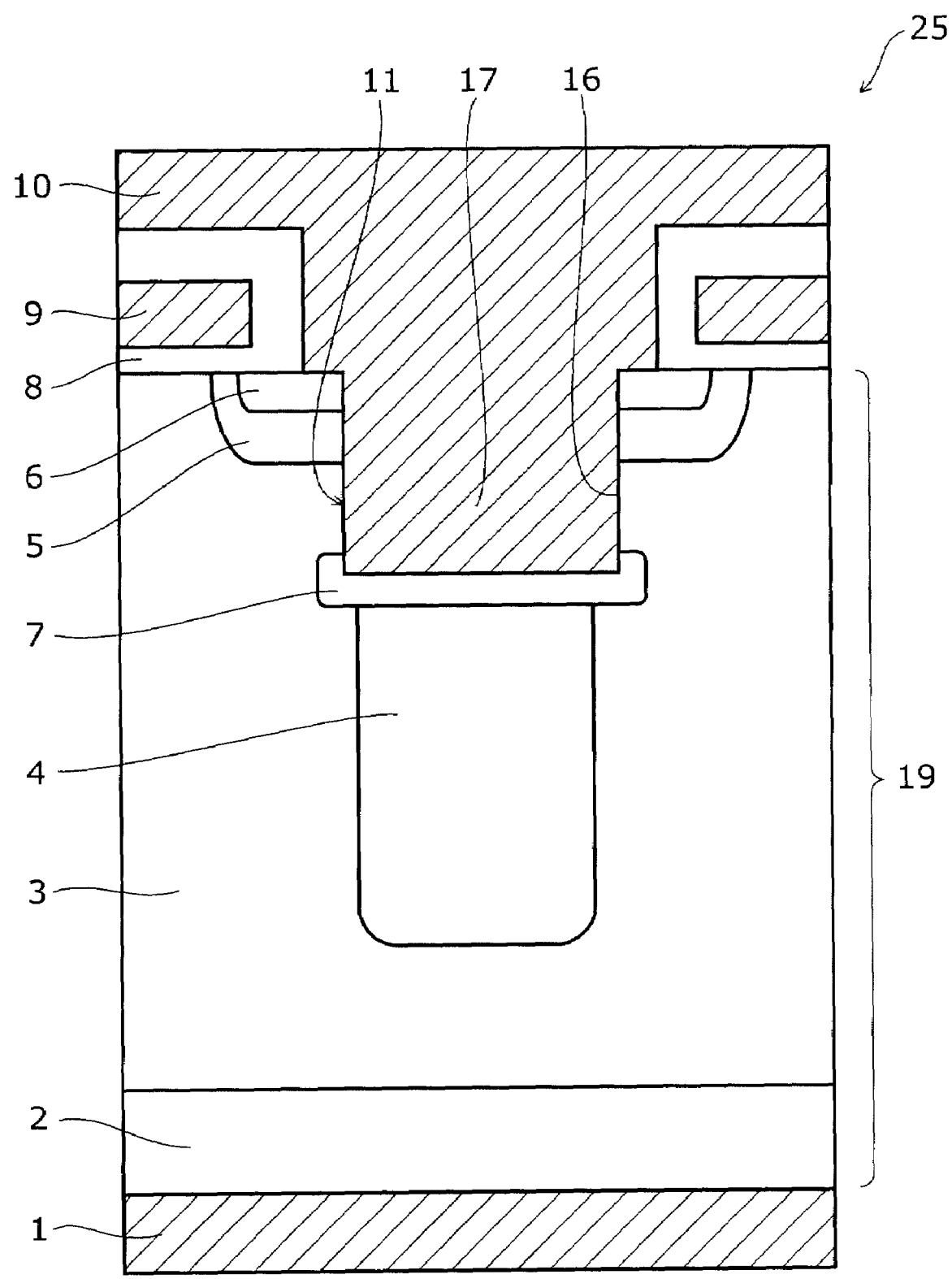
FIG. 10 is a cross-sectional view schematically illustrating the configuration of a power MOSFET according to a fifth embodiment of the invention.

FIG. 10 is a cross-sectional view schematically illustrating the configuration of a power MOSFET according to a fifth embodiment of the invention.

As shown in FIG. 10, in the power MOSFET 25 according to this embodiment, the trench contact 17 penetrates the p-base layer 5, a p$^+$-contact layer 7 is formed near the bottom of this trench contact 17, and the p$^+$-contact layer 7 is spaced from the p-base layer 5. Thus the side face of the trench contact 17 between the region in contact with the p-base layer 5 and the region in contact with the p$^+$-contact layer 7 is directly in contact with the n-pillar layer 3. Consequently, a Schottky junction 11 is formed from the source electrode 10 and the n-pillar layer 3, constituting a Schottky barrier diode (SBD). On the other hand, the power MOSFET 25 includes a pn diode formed from the p$^+$-contact layer 7, the p-pillar layer 4, and the n-pillar layer 3. Hence the power MOSFET 25 has a pn diode and a SBD in parallel.

In the normal operation of a power MOSFET, voltage is applied with the drain electrode being positive and the source electrode being negative. In response to the potential of the gate electrode, the MOS is switched on/off, allowing current to flow between the source and the drain. On the other hand, depending on the application of the power MOSFET, voltage may be applied with the drain electrode being negative and the source electrode being positive for passing current. In this case, in the power MOSFET according to the first to fourth embodiment described above, current flows only through the pn diode composed of the p-pillar layer 4 and the n-pillar layer 3. However, in this embodiment, besides this pn diode, current flows also through the SBD made of the Schottky junction 11. Thus a larger current can be passed. Furthermore, as compared with the pn diode, the SBD has lower offset voltage and smaller current loss, and hence is faster in switching. Hence the SBD improves both static and dynamic characteristics.

Moreover, because the SBD is built in, current can be passed without bipolar operation to some extent. Hence it is possible to decrease recovery charge during low current operation and to reduce recovery loss.

Furthermore, in this embodiment, the edge of the Schottky junction region is covered with the p-base layer 5 and the p$^+$-contact layer 7. Hence the electric field applied to the Schottky junction 11 decreases, and the reverse leak current decreases. On the other hand, as in the foregoing embodiments, the hole discharge resistance is small, and hence high withstand capability can be achieved.

Providing an SBD in conventional power MOSFETs entails burying the electrode for the SBD in the semiconductor substrate, which complicates the process and increases the manufacturing cost. Furthermore, electric field concentrates at the tip of the electrode, decreasing the breakdown voltage. In contrast, in this embodiment, the SBD can be formed by using a trench contact 17. Hence formation of the SBD does not entail the increase of the number of processes and the manufacturing cost. Furthermore, as described above in the second embodiment, the electric field near the trench contact can be decreased by optimizing the pillar concentration profile. Hence providing an SBD does not result in decreasing the breakdown voltage. The configuration, operation, and effect in this embodiment other than the foregoing are the same as those in the second embodiment described above, for example.

Next, a variation of the fifth embodiment is described.

Figure 11:
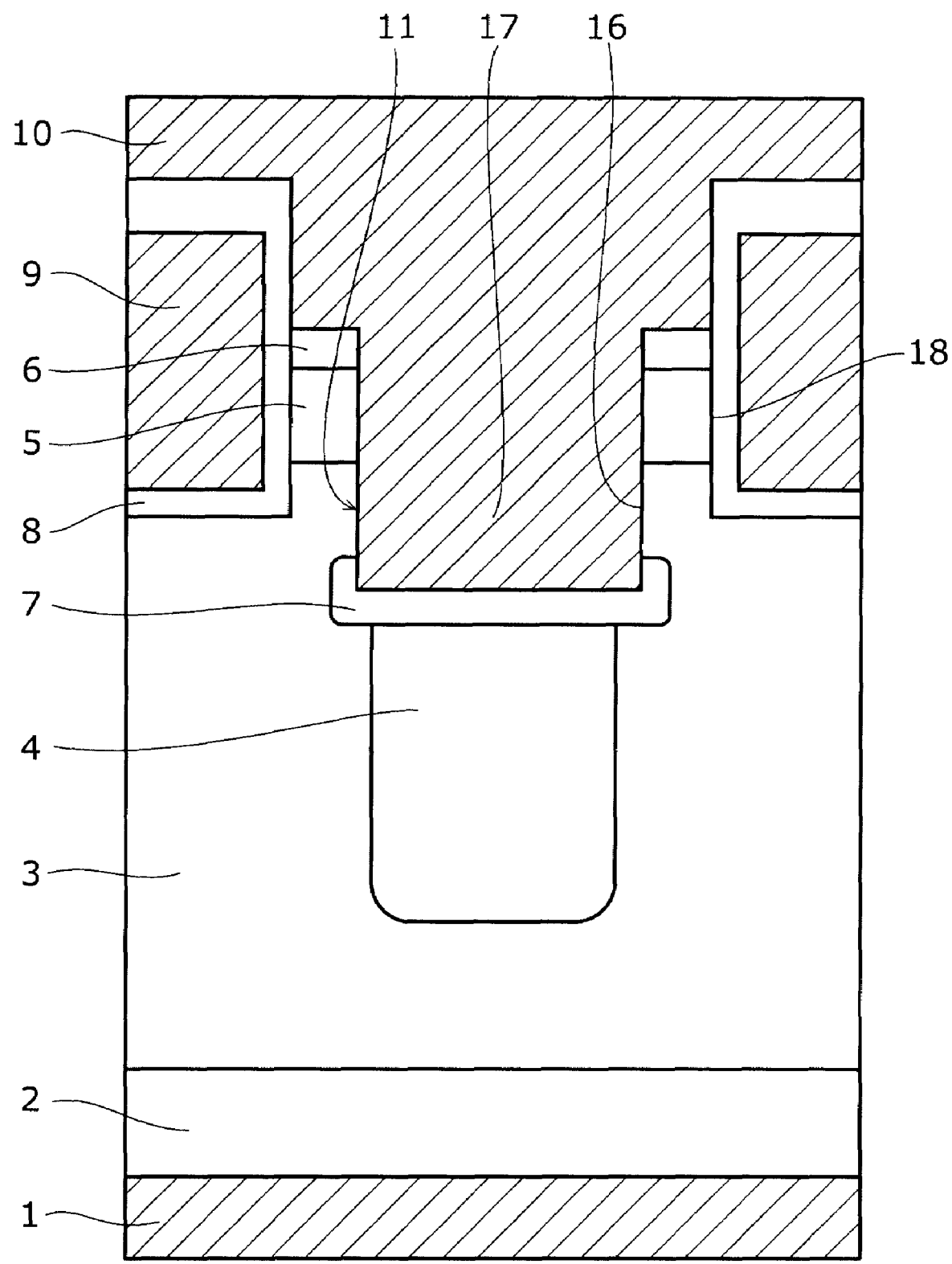
FIG. 11 is a cross-sectional view schematically illustrating a power MOSFET according to a variation of the fifth embodiment.

FIG. 11 is a cross-sectional view schematically illustrating a power MOSFET according to this variation.

As shown in FIG. 11, in this variation, the MOSFET gate has a trench gate structure. The configuration in this variation other than the foregoing is the same as that in the fifth embodiment. Also when the MOS gate has a trench gate structure as in this variation, the same effect as in the fifth embodiment can be achieved.

Sixth Embodiment

Figure 12:
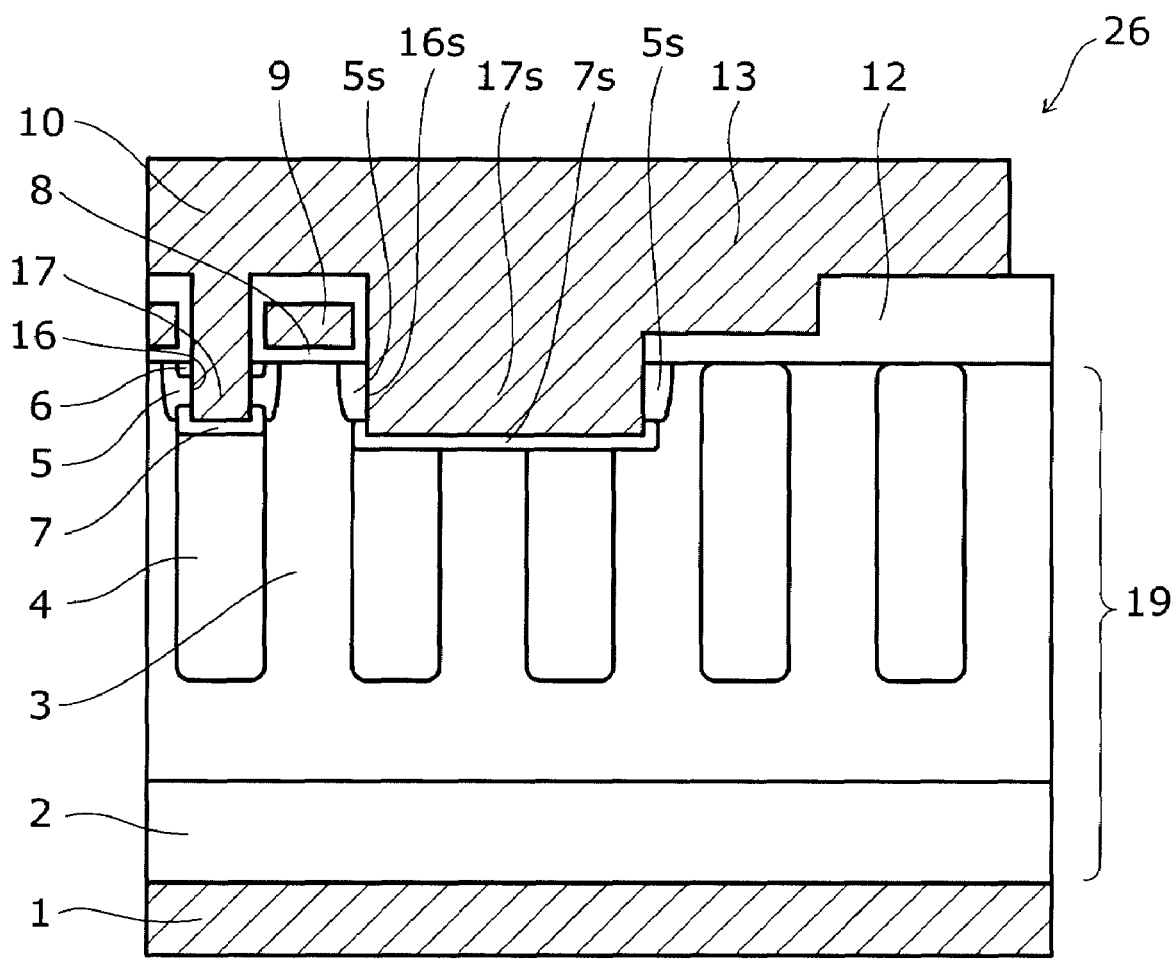
FIG. 12 is a cross-sectional view schematically illustrating the configuration of a power MOSFET according to a sixth embodiment of the invention.

FIG. 12 is a cross-sectional view schematically illustrating the configuration of a power MOSFET according to a sixth embodiment of the invention.

Figure 13:
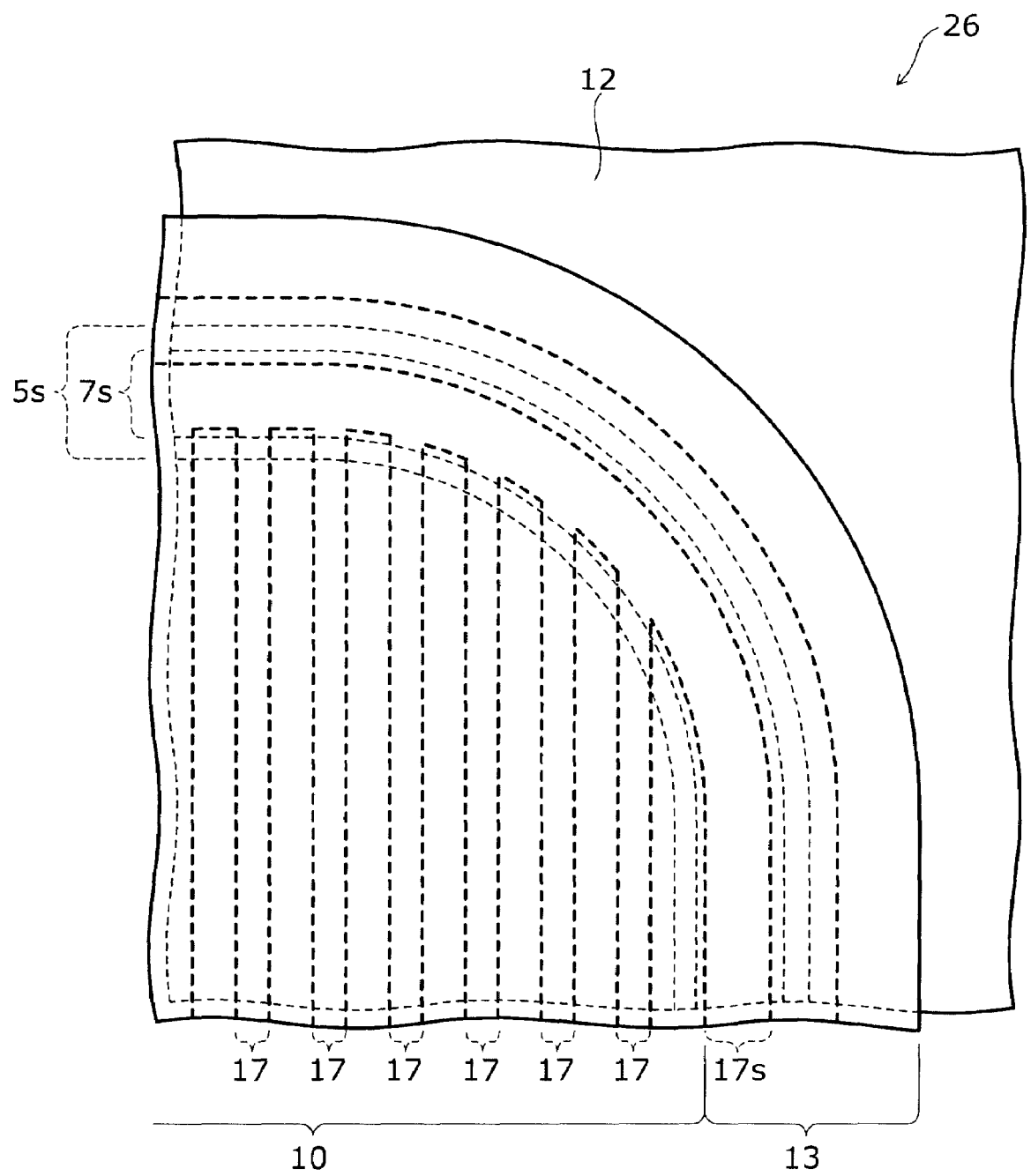
FIG. 13 is a plan view schematically illustrating the configuration of the power MOSFET according to the sixth embodiment.

FIG. 13 is a plan view schematically illustrating the configuration of the power MOSFET according to this embodiment.

FIGS. 12 and 13 show the structure including not only the cell section of the power MOSFET, but also the device termination section thereof. In FIG. 13, while the p-base layer 5 and the p$^+$-contact layer 7 in the cell section are not shown for ease of viewing, they are formed in a striped configuration along the trench contact 17.

As shown in FIGS. 12 and 13, in the power MOSFET 26 according to this embodiment, the device termination section includes a field insulating film 12 on the semiconductor substrate 19, and a field plate electrode 13 integrally formed with the source electrode 10 is provided on the field insulating film 12. The field plate electrode 13 surrounds the source electrode 10, and is shaped like a rectangular frame with its corners curved, or rounded, as viewed from above.

In the inner peripheral portion of the field plate electrode 13 is provided a trench contact 17s protruding downward. As viewed from above, the trench contact 17s is shaped like a rectangular frame with its corners curved. The trench contact 17s is buried in the trench 16s formed like a frame in the upper surface of the peripheral portion of the semiconductor substrate 19. The width of the trench 16s in the termination section is thicker than the trench 16 in the cell section, and hence the width of the trench contact 17s in the termination section is thicker than the trench contact 17s in the cell section. The depth of the trench 16s is slightly deeper than the depth of the trench 16.

A p-base layer 5s is formed around the trench contact 17s. Near the bottom of the trench contact 17s, a p$^+$-contact layer 7s is formed so as to protrude downward from the p-base layer 5s. That is, the lower surface of the p$^+$-contact layer 7s is located lower than the lower surface of the p-base layer 5s. As viewed from above, the p-base layer 5s and the p$^+$-contact layer 7s are shaped like a frame along the trench contact 17s.

On the other hand, the lower surface of the outer peripheral portion of the field plate electrode 13 is shaped like a staircase, with its lower surface ascending toward the outer periphery. Also directly below the field plate electrode 13, n-pillar layers 3 and p-pillar layers 4 are formed, constituting a superjunction structure.

In this embodiment, a frame-shaped p-base layer 5s is formed in the device termination section. The p-base layer 5s does not have a MOS gate structure, but includes a wide contact along with the p$^+$-contact layer 7s for discharging holes generated in the termination section. Along the frame-shaped p-base layer 5s, a frame-shaped trench 16s is formed concentrically with the p-base layer 5s, and a trench contact 17s is buried in the trench 16s. Thus holes can be efficiently discharged from the device termination section to enhance the breakdown voltage of the termination section.

The trench 16s in the termination section has a wider width than the trench 16 in the cell section. For process-related reasons, the trench deepens as its width increases. Hence the p$^+$-contact layer 7s is located slightly deeper than the p$^+$-contact layer 7 in the cell section. Thus holes in the termination section are discharged more easily, and higher withstand capability can be achieved.

If the p$^+$-contact layer 7s is formed at a deeper position, the drift layer for holding the breakdown voltage is thinned accordingly. Hence the breakdown voltage may decrease contrarily. Thus it is preferable that the impurity concentration in the n-pillar layer 3 and the p-pillar layer 4 formed in the termination section be lower than in the pillar layers of the cell section having the MOS gate structure.

Furthermore, in this embodiment, the p-base layer 5s is curved at the corners of the device. This can prevent electric field concentration at the edge of the p-base layer 5s. Moreover, the p$^+$-contact layer 7 is curved concentrically with the p-base layer 5. Hence holes can be discharged equally rapidly at any portion of the corner.

Furthermore, in this embodiment, the lower surface of the outer peripheral portion of the field plate electrode 13 is shaped like a staircase. This can prevent electric field concentration at a particular corner of the field plate electrode 13. Thus the breakdown voltage can be further enhanced. The configuration, operation, and effect in this embodiment other than the foregoing are the same as those in the first embodiment described above.

Next, a first variation of the sixth embodiment is described.

Figure 14:
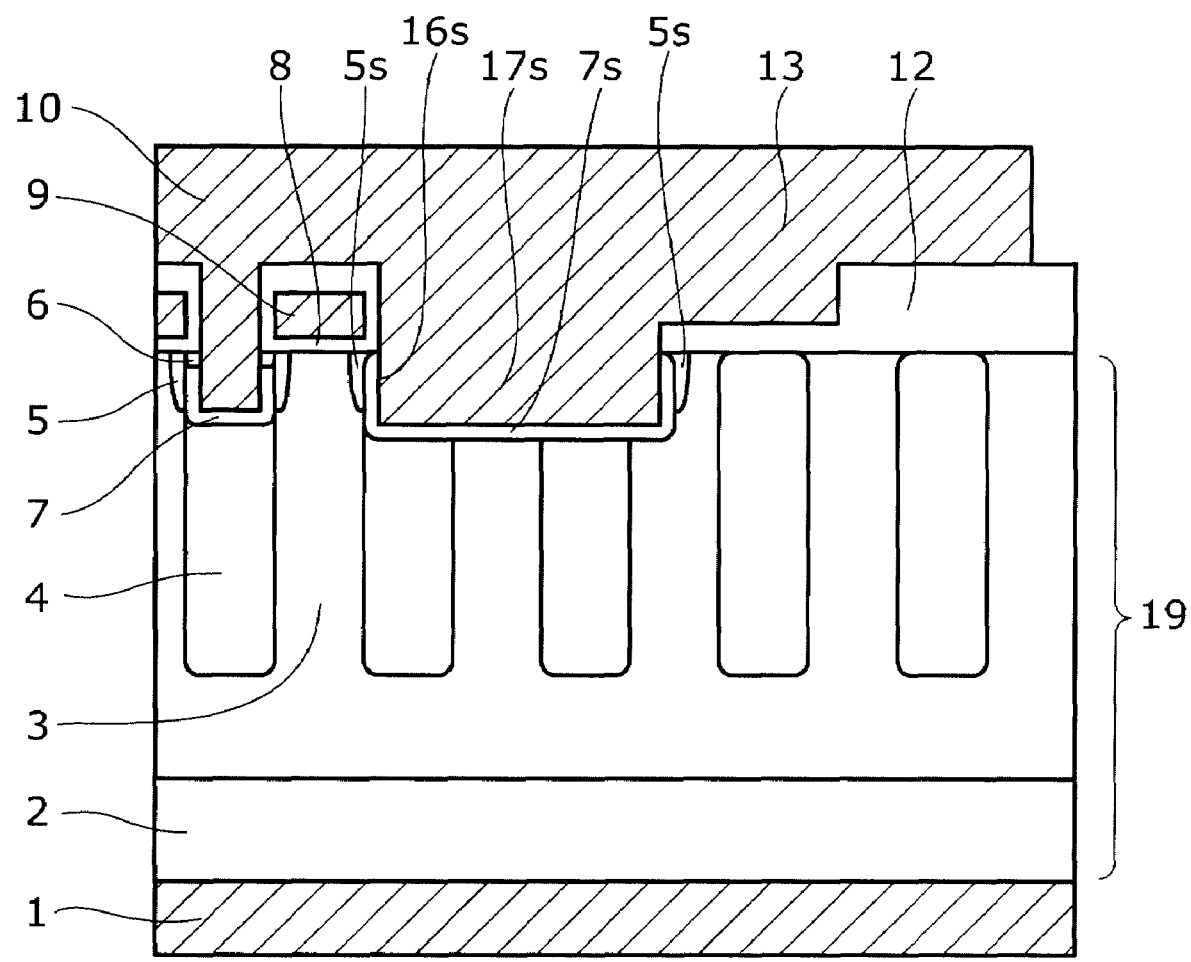
FIG. 14 is a cross-sectional view schematically illustrating a power MOSFET according to a first variation of the sixth embodiment.

FIG. 14 is a cross-sectional view schematically illustrating a power MOSFET according to this variation.

As shown in FIG. 14, in this variation, the p$^+$-contact layers 7 and 7s are formed to entirely cover the side face of the trench contacts 17 and 17s, respectively. Thus, by forming the p$^+$-contact layer 7s also on the sidewall of the trench 16s in the termination section, holes flowing in the surface of the semiconductor layer in the termination section can be rapidly discharged, and higher withstand capability can be achieved. The configuration, operation, and effect in this variation other than the foregoing are the same as those in the sixth embodiment described above.

Next, a second variation of the sixth embodiment is described.

Figure 15:
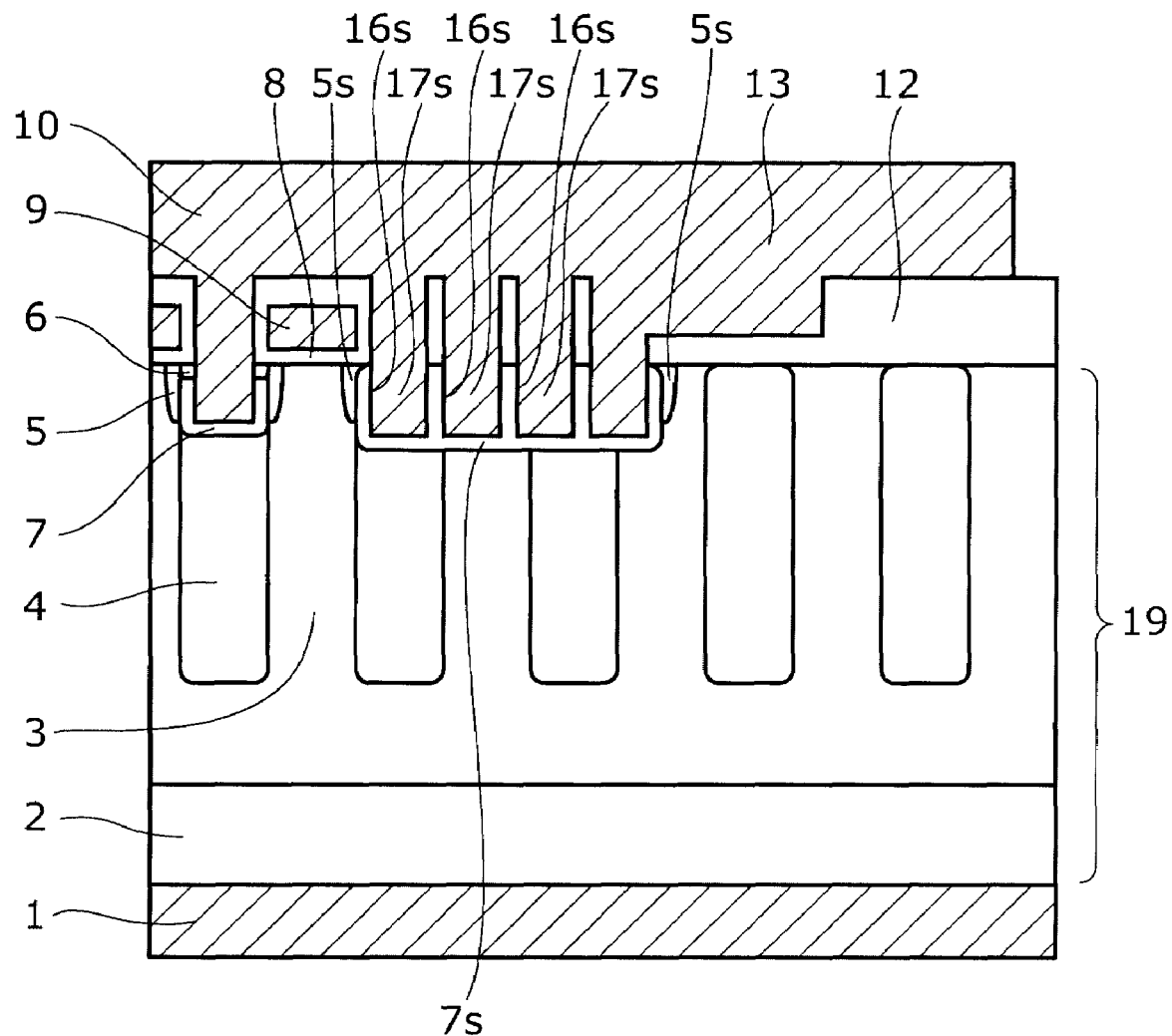
FIG. 15 is a cross-sectional view schematically illustrating a power MOSFET according to a second variation of the sixth embodiment.

FIG. 15 is a cross-sectional view schematically illustrating a power MOSFET according to this variation.

As shown in FIG. 15, in this variation, a plurality of trenches 16s are formed concentrically in the termination section. The width of each trench 16s is equal to the width of the trench 16 in the cell section. Hence the depth of the trench 16s can be equalized to the depth of the trench 16. Thus, in this variation, a plurality of trench contacts 17s are formed concentrically in the termination section, and the width and depth of each trench contact 17s are equal to the width and depth of the trench contact 17 in the cell section.

According to this variation, the thickness of the drift layer in the termination section can be equalized to that in the cell section. Thus the decrease of breakdown voltage in the termination section can be prevented more definitely. The configuration, operation, and effect in this variation other than the foregoing are the same as those in the sixth embodiment described above.

In the sixth embodiment and its first and second variation, the field plate electrode 13 is illustratively connected to the source electrode 10. However, the invention is not limited thereto, but the field plate electrode may be connected to the gate electrode. Furthermore, the termination structure based on the RESURF structure or the guard ring structure is also practicable. Moreover, the sixth embodiment and its first and second variation illustrate a configuration where the superjunction structure is formed also outside the p-base layer 5s in the termination section. However, the superjunction structure may be omitted in this portion.

The invention has been described with reference to the first to sixth embodiment and their variations. However, the invention is not limited to these embodiments and the like. For example, in the description of the above embodiments, it is assumed that the first conductivity type and the second conductivity type are n-type and p-type, respectively. However, it is also practicable that the first conductivity type and the second conductivity type are p-type and n-type, respectively. Furthermore, the planar pattern of the MOS gate section and the superjunction structure is not limited to the striped configuration, but may be formed in a lattice or staggered configuration, for example.

Furthermore, the p-pillar layer 4 may be in contact with the n$^+$-drain layer 2. Also in this case, the same effect as in the above embodiments is achieved. It is likewise practicable that a layer having a lower impurity concentration than the n-pillar layer 3 is inserted between the superjunction structure and the n$^+$-drain layer 2.

Moreover, the above embodiments and variations can be practiced in combination. For example, in the sixth embodiment and its first and second variation (see FIGS. 12 to 14), the cell section illustratively has the same configuration as the first embodiment (see FIG. 1) or its second variation (see FIG. 3). However, the invention is not limited thereto, but the sixth embodiment and its first and second variation can be practiced in combination with any other embodiment or variation.

In the description of the above embodiments and variations, silicon (Si) is used as the semiconductor in the MOSFETs. However, compound semiconductors such as silicon carbide (SiC) or gallium nitride (GaN), or wide bandgap semiconductors such as diamond can be also used as the semiconductor.

In the description of the above embodiments, the power semiconductor device is illustratively a MOSFET. However, the invention is suitably applicable to any power semiconductor devices having a superjunction structure. For example, the invention is applicable to SBDs, pin diodes, or IGBTs (insulated gate bipolar transistors).

The invention claimed is:

1. A power semiconductor device comprising:
    a semiconductor substrate;
    a gate insulating film;
    a control electrode insulated from the semiconductor substrate by the gate insulating film;
    a first main electrode provided on a lower surface side of the semiconductor substrate; and
    a second main electrode provided on an upper surface side of the semiconductor substrate,
    the semiconductor substrate including:
        a first first-conductivity-type semiconductor layer with its lower surface connected to the first main electrode;
        a second first-conductivity-type semiconductor layer and a third second-conductivity-type semiconductor layer formed on the first first-conductivity-type semiconductor layer and alternately arranged parallel to the upper surface of the semiconductor substrate;
        a trench formed in a directly overlying region of the third second-conductivity-type semiconductor layer, with part of the second main electrode buried in the trench;
        a fourth second-conductivity-type semiconductor layer selectively formed in a surface of the second first-conductivity-type semiconductor layer and connected to the second main electrode;
        a fifth first-conductivity-type semiconductor layer selectively formed in a surface of the fourth second-conductivity-type semiconductor layer and connected to the second main electrode; and a sixth second-conductivity-type semiconductor layer formed at a bottom of the trench and connected to the second main electrode, impurity concentration in the sixth second-conductivity-type semiconductor layer being higher than impurity concentration in the fourth second-conductivity-type semiconductor layer, and lower surface of the sixth second-conductivity-type semiconductor layer being located below lower surface of the fourth second-conductivity-type semiconductor layer.

2. The power semiconductor device according to claim 1, wherein impurity amount in at least one of the second first-conductivity-type semiconductor layer and the third second-conductivity-type semiconductor layer varies in thickness direction of the semiconductor substrate, in an upper part of a portion composed of the second first-conductivity-type semiconductor layer and the third second-conductivity-type semiconductor layer, the impurity amount in the third second-conductivity-type semiconductor layer is larger than the impurity amount in the second first-conductivity-type semiconductor layer, and in a lower part of the portion composed of the second first-conductivity-type semiconductor layer and the third second-conductivity-type semiconductor layer, the impurity amount in the third second-conductivity-type semiconductor layer is smaller than the impurity amount in the second first-conductivity-type semiconductor layer.

3. The power semiconductor device according to claim 2, wherein impurity amount in at least one of the second first-conductivity-type semiconductor layer and the third second-conductivity-type semiconductor layer varies continuously in thickness direction of the semiconductor substrate.

4. The power semiconductor device according to claim 2, wherein impurity amount in at least one of the second first-conductivity-type semiconductor layer and the third second-conductivity-type semiconductor layer varies stepwise in thickness direction of the semiconductor substrate.

5. The power semiconductor device according to claim 1, wherein depth of the trench is substantially equal to junction depth of the fourth second-conductivity-type semiconductor layer.

6. The power semiconductor device according to claim 1, wherein width of a portion located above the semiconductor substrate in a protruding portion of the second main electrode is larger than width of a portion buried in the trench in the protruding portion.

7. The power semiconductor device according to claim 1, wherein the sixth second-conductivity-type semiconductor layer is formed also on a sidewall of the trench.

8. The power semiconductor device according to claim 1, wherein insulated gate structure composed of the fourth second-conductivity-type semiconductor layer, the fifth first-conductivity-type semiconductor layer, the second first-conductivity-type semiconductor layer, the gate insulating film, and the control electrode constitutes a planar gate structure.

9. The power semiconductor device according to claim 1, wherein a gate trench is formed in an upper surface of the semiconductor substrate, part of the gate insulating film is formed on an inner surface of the gate trench, and a lower portion of the control electrode is buried inside the gate trench.

10. The power semiconductor device according to claim 9, wherein lower surface of the sixth second-conductivity-type semiconductor layer is located below lower surface of the control electrode.

11. The power semiconductor device according to claim 10, wherein lower surface of a portion buried in the trench in the second main electrode is located below the lower surface of the control electrode.

12. The power semiconductor device according to claim 1, wherein the sixth second-conductivity-type semiconductor layer is spaced from the fourth second-conductivity-type semiconductor layer, and on side face of a portion buried in the trench in the second main electrode, region between region in contact with the fourth second-conductivity-type semiconductor layer and region in contact with the sixth second-conductivity-type semiconductor layer is in contact with the second first-conductivity-type semiconductor layer.

13. The power semiconductor device according to claim 1, further comprising a field insulating film provided on the semiconductor substrate in a termination section, and a field plate electrode in a rectangular frame configuration provided on the field insulating film.

14. The power semiconductor device according to claim 13, wherein lower surface of outer peripheral portion of the field plate electrode is shaped like a staircase, with its lower surface ascending toward outer periphery.

15. The power semiconductor device according to claim 13, wherein the field plate electrode is connected to one of the second major electrode and the control electrode.

16. The power semiconductor device according to claim 13, wherein corner of the trench formed at outer side of a termination section is rounded.

17. The power semiconductor device according to claim 16, wherein the sixth second-conductivity-type semiconductor layer formed in the termination section is formed deeper than the sixth second-conductivity-type semiconductor layer formed in a cell section.

18. The power semiconductor device according to claim 17, wherein impurity concentration in the second first-conductivity-type semiconductor layer and the third second-conductivity-type semiconductor layer formed in the termination section is lower than impurity concentration in the second first-conductivity-type semiconductor layer and the third second-conductivity-type semiconductor layer formed in the cell section.

19. The power semiconductor device according to claim 16, wherein the sixth second-conductivity-type semiconductor layer is formed to entirely cover side face of a portion buried in the semiconductor substrate in the second main electrode.

20. The power semiconductor device according to claim 16, wherein a plurality of portions in the second major electrode are buried in the termination section and width of the each portion is equal to width of a portion of the second major electrode buried in a cell section.

* * * * *